United States Patent
Li et al.

(10) Patent No.: US 7,666,474 B2
(45) Date of Patent: Feb. 23, 2010

(54) PLASMA-ENHANCED PULSED DEPOSITION OF METAL CARBIDE FILMS

(75) Inventors: Dong Li, Phoenix, AZ (US); Steven Marcus, Tempe, AZ (US); Glen Wilk, Scottsdale, AZ (US); Brennan Milligan, Gold Canyon, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 12/116,894

(22) Filed: May 7, 2008

(65) Prior Publication Data

US 2009/0280267 A1 Nov. 12, 2009

(51) Int. Cl.
*H05H 1/00* (2006.01)
*C23C 16/00* (2006.01)

(52) U.S. Cl. .................. 427/249.1; 427/535; 427/569

(58) Field of Classification Search .................. None
See application file for complete search history.

(56) References Cited

U.S. PATENT DOCUMENTS

| | | |
|---|---|---|
| 3,708,728 A | 1/1973 | Sterling et al. |
| 4,058,430 A | 11/1977 | Suntola et al. |
| 4,085,430 A | 4/1978 | Gerkema et al. |
| 4,282,267 A | 8/1981 | Kuyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi et al. |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |

(Continued)

FOREIGN PATENT DOCUMENTS

EP 0 387 403 A1 9/1990

(Continued)

OTHER PUBLICATIONS

1988RD-0296076 (Nov. 20, 1998) "Field effect transistor structure with improved transconductant—contg. spacer-less conducting gate oxide, and tungsten deposited on source and drain," Sep. 19, 2005, East Version 2.0.1.4 Patent-Assignee: Anonymous[Anon].

(Continued)

*Primary Examiner*—Shamim Ahmed
(74) *Attorney, Agent, or Firm*—Knobbe, Martens, Olson & Bear LLP

(57) ABSTRACT

Methods of forming a metal carbide film are provided. In some embodiments, a substrate is exposed to alternating pulses of a transition metal species and plasma-excited argon. The transition metal species is reacted with a carbon species to deposit a metal carbide film. The substrate is exposed to the carbon species simultaneously with the transition metal species, or the substrate is exposed to the carbon species in pulses temporally separated from the pulses of the transition metal species. In some embodiments, the carbon species and the transition metal species form parts of the same precursor compound, e.g., a metal organic compound.

31 Claims, 4 Drawing Sheets

U.S. PATENT DOCUMENTS

| | | | |
|---|---|---|---|
| 5,281,274 A | 1/1994 | Yoder | |
| 5,306,666 A | 4/1994 | Izumi | |
| 5,316,793 A | 5/1994 | Wallace et al. | |
| 5,342,652 A | 8/1994 | Foster et al. | |
| 5,356,673 A | 10/1994 | Schmitt et al. | |
| 5,382,333 A | 1/1995 | Ando et al. | |
| 5,438,028 A | 8/1995 | Weissman et al. | |
| 5,443,647 A | 8/1995 | Aucoin et al. | |
| 5,595,784 A | 1/1997 | Kaim et al. | |
| 5,603,771 A | 2/1997 | Seiberras et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |
| 5,744,254 A | 4/1998 | Kampe et al. | |
| 5,769,950 A | 6/1998 | Takasu et al. | |
| 5,789,024 A | 8/1998 | Levy et al. | |
| 5,855,680 A | 1/1999 | Soininen et al. | |
| 5,915,004 A | 6/1999 | Pabbati et al. | |
| 5,916,365 A | 6/1999 | Sherman | |
| 5,946,598 A | 8/1999 | Yeh | |
| 5,961,365 A | 10/1999 | Lambert | |
| 5,964,943 A | 10/1999 | Stein et al. | |
| 5,965,004 A | 10/1999 | Cowley et al. | |
| 5,972,430 A | 10/1999 | DiMeo et al. | |
| 5,973,400 A | 10/1999 | Murakami et al. | |
| 6,006,763 A | 12/1999 | Mori et al. | |
| 6,015,590 A | 1/2000 | Suntola et al. | |
| 6,087,257 A | 7/2000 | Park et al. | |
| 6,099,904 A | 8/2000 | Mak et al. | |
| 6,104,074 A | 8/2000 | Chen | |
| 6,113,977 A | 9/2000 | Soininen et al. | |
| 6,139,700 A | 10/2000 | Kang et al. | |
| 6,156,382 A | 12/2000 | Rajagopalan et al. | |
| 6,162,501 A | 12/2000 | Kim | |
| 6,188,134 B1 | 2/2001 | Stumborg et al. | |
| 6,200,389 B1 | 3/2001 | Miller et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,234,646 B1 | 5/2001 | Ito | |
| 6,270,572 B1 | 8/2001 | Kim et al. | |
| 6,284,646 B1 | 9/2001 | Leem | |
| 6,287,965 B1 | 9/2001 | Kang et al. | |
| 6,342,277 B1 | 1/2002 | Sherman | |
| 6,355,561 B1 | 3/2002 | Sandhu et al. | |
| 6,380,627 B1 | 4/2002 | Weihs et al. | |
| 6,416,577 B1 | 7/2002 | Suntola et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,511,539 B1 | 1/2003 | Raaijmakers et al. | |
| 6,534,395 B2 | 3/2003 | Werkhoven | |
| 6,576,053 B1 | 6/2003 | Kim et al. | |
| 6,599,572 B2 | 7/2003 | Saanila et al. | |
| 6,616,982 B2 | 9/2003 | Merrill et al. | |
| 6,652,924 B2 | 11/2003 | Sherman | |
| 6,706,115 B2 | 3/2004 | Leskela et al. | |
| 6,727,169 B1 | 4/2004 | Saanila et al. | |
| 6,794,287 B2 | 9/2004 | Saanila et al. | |
| 6,797,340 B2 | 9/2004 | Fang et al. | |
| 6,800,383 B1 | 10/2004 | Lakhotkin | |
| 6,800,552 B2 | 10/2004 | Elers et al. | |
| 6,809,026 B2 | 10/2004 | Yoon et al. | |
| 6,821,889 B2 | 11/2004 | Elers et al. | |
| 6,827,978 B2 | 12/2004 | Yoon et al. | |
| 6,833,161 B2 | 12/2004 | Wang et al. | |
| 6,863,727 B1 | 3/2005 | Elers et al. | |
| 6,986,914 B2 | 1/2006 | Elers et al. | |
| 7,138,336 B2 | 11/2006 | Lee et al. | |
| 7,211,144 B2 | 5/2007 | Lu et al. | |
| 7,268,078 B2 | 9/2007 | Iyer | |
| 2003/0032281 A1 | 2/2003 | Werkhoven et al. | |
| 2003/0049931 A1 | 3/2003 | Byun et al. | |
| 2003/0082296 A1* | 5/2003 | Elers et al. ................ 427/96 |
| 2003/0104126 A1 | 6/2003 | Fang et al. | |
| 2003/0123216 A1 | 7/2003 | Yoon et al. | |
| 2003/0127043 A1 | 7/2003 | Lu et al. | |
| 2003/0153181 A1 | 8/2003 | Yoon et al. | |
| 2003/0157760 A1 | 8/2003 | Xi et al. | |
| 2003/0161952 A1 | 8/2003 | Wang et al. | |
| 2003/0181035 A1 | 9/2003 | Yoon et al. | |
| 2003/0194825 A1 | 10/2003 | Law et al. | |
| 2003/0203616 A1 | 10/2003 | Chung et al. | |
| 2004/0206008 A1 | 10/2004 | Sung | |
| 2004/0208994 A1* | 10/2004 | Harkonen et al. ........ 427/249.1 |
| 2005/0106877 A1 | 5/2005 | Elers et al. | |
| 2006/0019494 A1 | 1/2006 | Cao et al. | |
| 2006/0079090 A1 | 4/2006 | Elers et al. | |
| 2006/0147626 A1* | 7/2006 | Blomberg ................ 427/248.1 |
| 2006/0211224 A1 | 9/2006 | Matsuda et al. | |
| 2006/0220249 A1* | 10/2006 | Johnston et al. ............ 257/751 |
| 2006/0251812 A1 | 11/2006 | Kang et al. | |
| 2007/0069177 A1* | 3/2007 | Peters et al. ............. 252/182.1 |
| 2007/0148350 A1 | 6/2007 | Rahtu et al. | |
| 2008/0102204 A1* | 5/2008 | Elers ...................... 427/249.1 |
| 2008/0102205 A1* | 5/2008 | Barry et al. ................ 427/250 |

FOREIGN PATENT DOCUMENTS

| | | |
|---|---|---|
| EP | 0 394 054 A1 | 10/1990 |
| EP | 0 442 490 A1 | 8/1991 |
| EP | 0528779 A1 | 2/1993 |
| EP | 0528779 B1 | 2/1993 |
| EP | 0 573 033 A1 | 12/1993 |
| EP | 0526779 B1 | 10/1995 |
| EP | 0 774 533 A1 | 5/1997 |
| EP | 0899779 A2 | 3/1999 |
| EP | 0899779 A3 | 3/1999 |
| EP | 1 158 070 A | 11/2001 |
| EP | 1 167 567 A1 | 1/2002 |
| JP | 6037041 | 2/1994 |
| JP | 6069157 | 3/1994 |
| JP | 7230957 | 8/1995 |
| JP | 8264530 A2 | 10/1996 |
| JP | 09 087857 A | 3/1997 |
| KR | 2001-88044 | 12/2001 |
| KR | 2002-31160 | 6/2002 |
| KR | 2002-87192 | 12/2002 |
| KR | 2003-5727 | 1/2003 |
| KR | 2003-14115 | 3/2003 |
| KR | 2003-14117 | 3/2003 |
| KR | 2003-33234 | 5/2003 |
| KR | 2003-40758 | 6/2003 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/47796 | 8/2000 |
| WO | WO 00/54320 | 9/2000 |
| WO | WO 00/63957 | 10/2000 |
| WO | WO 01/27347 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/53565 | 7/2001 |
| WO | WO 01/66832 A1 | 9/2001 |
| WO | WO 01/78123 | 10/2001 |
| WO | WO 01/78213 | 10/2001 |
| WO | WO 01/88972 | 11/2001 |
| WO | WO 2004/077515 A | 9/2004 |

| | | | |
|---|---|---|---|
| WO | WO 2006/080782 A | 8/2006 | |

OTHER PUBLICATIONS

Andricacos et al., "Damascene copper electroplating for chip," *IBM Jour. Research and Dev.*, 42:567 (1998).

Bain et al., "Deposition of tungsten by plasma enhanced chemical vapour deposition," *J. Phys. IV France*, vol. 9, pp. 827-833 (1999).

Chang et al., "Chemical vapor deposition of tantalum carbide and carbonitride thin film from $Me_3CE=Ta(CH_2CMe_3)_3$ (E = Ch, N)," *The Royal Society of Chemistry* (2003), pp. 365-369.

Elers et al., "NbCl5 as a precursor in atomic layer epitaxy," *Applied Surface Science*, 82/83:468-474 (1994).

Favis et al., "Atomic layer epitaxy of silicon, silicon/germanium and silicon carbide via extraction/exchange processes," Avail. NTIS. Report (1991), 33 pp. From: Gov. Rep. Announce. Index (U.S.) 1991, 91(13), Abstr. No. 135,319.

Fuyuki et al., "Atomic layer epitaxy controlled by surface superstructures in silicon carbide," *Thin Solid Films* (1993), 225(1-2), pp. 225-229.

Fuyuki et al., "Atomic layer epitaxy of cubic silicon carbide by gas source MBE using surface superstructure," *J. Cryst. Growth* (1989), 95(1-4), pp. 461-463.

Girolami et al. "Tailored Organometallics as Low-Temperature CVD Precursors to Thin Films," *Materials Research Society Symposium Proceedings*, vol. 121, pp. 429-438 (1988).

Hara et al., "Atomic layer control of .beta.-silicon carbide (001) surface," Springer Proc. Phys. (1992), 71(Amorphous and Crystalline Silicon Carbide IV), pp. 90-95.

Hiltunen et al., "Nitrides of titanium, niobium, tantalum and molybdenum grown as thin films by the atomic layer epitaxy method," *Thin Solid Fims*, 166:149-154 (1988).

International Search Report and Written Opinion dated Apr. 7, 2008, Application No. PCT/US2007/082131.

Jehn et al., "Gmelin Handbook of Inorganic and Organometallic Chemistry," 8th Edition, vol. A 5b, No. 54, pp. 131-154 (1993).

Jeon, H., "A Study on the Characteristics of TiN Thin Film Deposited by Atomic Layer Chemical Vapor Deposition Method," *AVS 46th International Symposium*, Seattle, WA, abstract TF0MoP17 (1999).

Jeon, H., et al., "A Study on the Characteristics of TiN Thin Film Deposited by Atomic Layer Chemical Vapor Deposition Method," *J. Vac .Sci. Technol. A*, 18(4), 1595-1598 (2000).

Juppo et al., "Deposition of copper films by an alternate supply of CuCl and Zn," *J. Vac. Sci. Technol A*, vol. 15, No. 4, pp. 2330-2333, (Jul./Aug. 1997).

Kim et al., Applied Physics Letters, vol. 82, No. 25, pp. 4486-4488, (Jun. 23, 2003).

Kirk-Othmer, "Encyclopedia of Chemical Technology," 4th Edition, vol. 4, John Wiley & Sons, Inc., pp. 841-878, (1992).

Klaus et al., "Atomic Layer Deposition of Tungsten Nitride Films Using Sequential Surface Reactions," *Journal of the Electrochemical Society*, vol. 147, No. 3, pp. 1175-1181 (2000).

Klaus et al., "Atomic layer deposition of tungsten using sequential surface chemistry with a sacrificial stripping reaction," *Thin Solid Films*, vol. 360, pp. 145-153, (2000).

Klaus et al., "Atomically controlled growth of tungsten and tungsten nitride using sequential surface reactions," *Applied Surface Science*, vols. 162-163, pp. 479-491 (2000).

Klaus, J.W., et al., "Atomic layer deposition of tungsten and tungsten nitride using sequential surface raections,"*AVS 46th International Symposium*, Seattle, WA, abstract TF-TuM6 (1999).

Lai et al., "Precursors for Organometallic Chemical Vapor Deposition of Tungsten Carbide Films,"*Chem. Mater.*, vol. 7, pp. 2284-2292, (1995).

Leskelä, et al., "ALD precursor chemistry: Evolution and future challenges," *Jour. Phys. IV France 9*, 837-852 (1999).

Ludviksson et al., "Low-Temperature Thermal CVD of Ti-Al Metal Films Using a Strong Reducing Agent," *Chem. Vap. Deposition*, vol. 4, No. 4, pp. 129-132, (1998).

Martensson et al., "Atomic Layer Epitaxy of Copper and Tantalum," Chemical Vapor Deposition, vol. 3, No. 1, pp. 45-50, (1997).

Martensson et al., "CU(THD)$_2$ As Copper Source in Atomic Layer Epitaxy," *Electrochemical Society Proceedings*, vol. 97-25, pp. 1529-1536 (1997).

Martensson, "Use of atomic layer epitaxy for fabrication of Si/TiN/Cu structures," *J. Vac. Sci. Technol. B*, vol. 17, No. 5, pp. 2122-2128 (Sep./Oct. 1999).

Matsunami et al., "Hetero-interface control and atomic layer epitaxy of SiC." *Applied Surface Science* (1997), 112 171-175.

Min et al., "Atomic Layer Deposition of TiN Films by Alternate Supply of Tetrakis (ethylmethylamino)-Titanium and Ammonia," *Jpn. J. Appl. Phys.*, vol. 37, pp. 4999-5004 (1998).

Min et al., "Atomic Layer Deposition on TiN Thin Films by Sequential Introduction of Ti Precursor and NH$_3$," Mat. Res. Soc. Symp. Proc., vol. 514, pp. 337-342 (1998).

Nakajima et al., "Chemical Vapor Deposition of Tungsten Carbide, Molybdenum Carbide Nitride, and Molybdenum Nitride Films," *J. Electrochem. Soc.*, vol. 144,. No. 6, pp. 2096-2100 (Jun. 1997).

Polyakov et al., "Growth of GaBN Ternary Soloutions by Organometallic Vapor Phase Epitaxy," *Journal of Electronic Materials*, Vo. 26, No. 3, pp. 237-242, (1997).

Ritala et al., "Atomic layer epitaxy growth of TiN thin films," *J. Electrochem. Soc.*, 142(8):2731-2737 (1995).

Ritala et al., "Effects of intermediate zinc pulses on properties on TiN and NbN films deposited by atomic layer epitaxy," *Appl. Surf. Sci.*, 120:199-212 (1997).

Ritala et al., "Atomic Layer Epitaxy Growth on TiN Thin Films from TiI$_4$ and NH$_3$," *J. Electrochem. Soc.*, vol. 145, No. 8, pp. 2914-2920 (Aug. 1998).

Ritala et al., "Perfectly conformal TiN and Al2O3 films deposited by atomic layer deposition," *Chem. Vapor Deposition*,5:7-9 (1999).

Ryu et al., "Barriers for copper interconnections," *Solid State Technology*, April, 53 (1999).

Sadayuki et al., "Sub-atomic layer growth of SiC at low temperatures," *Japanese Journal of Applied Physics*, Part 1: Regular Papers, Short Notes & Review Papers (1995), 34(11), pp. 6166-6170.

Sherman et al., "Plasma enhanced atomic layer deposition of Ta for diffusion barrier applications," AVS 46th International Symposium, Paper TF-TuM5 (abstract), (Oct. 26, 1999), Seattle, WA.

Suntola, "Handbook of Crystal Growth 3", Thin Films and Epitaxy, Part B: Growth Mechanisms and Dynamics, Chapter 14, Atomic Layer Epitaxy, pp. 601-663, Elsevier Science B.V. 1994.

Tulhoff et al., "Ullmann's Encyclopedia of Industrial Chemistry," 5$^{th}$, Completely Revised Edition, vol. A5, pp. 61-77 (1986).

Yang et al., "Atomic Layer Deposition of Tungsten Film from WF6/B2H6: Nucleation Layer for Advanced Semiconductor Devices." Advanced Metallization Conference 2001 (AMC 2001), Conference Proceedings ULSI XVII@2002 Materials Research Society, pp. 655-660.

U.S. Appl. No. 10/100,500, filed Mar. 15, 2002; Office Action sent Mar. 28, 2003; Notice of Allowance Aug. 11, 2003.

U.S. Appl. No. 10/110,730, filed Apr. 11, 2002; Office Actions sent Jan. 14, 2004 and Dec. 22, 2004; Notice of Allowance Jul. 6, 2004.

U.S. Appl. No. 10/242,368, filed Sep. 12, 2002; Office Actions sent Apr. 27, 2004, Oct. 20, 2004, and Nov. 29, 2005; Notice of Allowance Jul. 14, 2005.

U.S. Appl. No. 11/627,749, filed Jan. 27, 2007; Office Actions sent May 2, 2007 and Nov. 13, 2007.

* cited by examiner

PLASMA-ENHANCED PULSED DEPOSITION OF METAL CARBIDE FILMS

BACKGROUND OF THE INVENTION

1. Field of the Invention

The present invention relates generally to vapor deposition processes and, more particularly, to deposition of metal carbide films by vapor deposition processes.

2. Description of the Related Art

The integration level of components in integrated circuits is constantly increasing, which demands a decrease in the sizes of integrated circuit (IC) components and interconnects. The trend of decreasing feature size is evident, for example, in memory circuits or devices such as dynamic random access memories (DRAMs), flash memory, static random access memories (SRAMs), ferroelectric (FE) memories, and integrated circuit components, such as gate electrodes and diffusion barriers in complementary metal oxide semiconductor (CMOS) devices.

As integration levels have increased, metal carbides have found use in various applications in the electronics industry, from gate electrodes to diffusion barriers. For example, tantalum carbide (TaC) is a low resistivity metal that can be used as an n-type metal oxide semiconductor (NMOS) gate electrode. Further, TaC has been found to be effective at inhibiting electromigration of noble metal atoms at the interface between metal interconnects and metal lines.

Generally, carbides of transition metal elements are in groups 4, 5, 6, 7, 8, 9, 10 and 11 of the periodic table. Transition metal carbides are relatively inert, have very high melting points, are extremely hard and wear resistant, and have high thermal conductivity and metal-like electrical conductivity. For these reasons, transition metal carbides have been proposed for use as low resistance diffusion barriers in semiconductor fabrication (see, e.g., international patent application WO 00/01006; U.S. Pat. No. 5,916,365).

Transition metal carbides can have a wide range of compositions. Ordered and disordered carbon deficient forms exist, of which the tungsten carbides, $WC_x$, are examples. In these forms, carbon resides in the interstitial cavities between metal atoms. General information about metal carbides can be found, for example, in Ullmann's Encyclopedia of Industrial Chemistry, $5^{th}$ Edition, Vol. A5, VCH Verlagsgesellschaft, 1986, pp. 61-77, and in the Kirk-Othmer Encyclopedia of Chemical Technology, $4^{th}$ Edition, Vol. 4, John Wiley & Sons, Inc., 1992, pp. 841-878.

The metal carbide films can be formed by various methods, including chemical vapor deposition (CVD), physical vapor deposition (PVD) and atomic layer deposition (ALD), sometimes also referred to as atomic layer epitaxy (ALE).

A "thermal" ALD method of forming metal carbide films, wherein the substrate is sequentially and alternately contacted with vapor phase pulses of two or more source chemicals, is described in, for example, U.S. Pat. No. 6,482,262. According to the methods described therein, a transition metal source chemical and carbon source gas are alternately and sequentially pulsed into a reaction space comprising a substrate, which is maintained at an elevated temperature. The pulsing sequence is repeated to form a metal carbide (e.g., TaC) film of desired thickness. Due to the self-limiting nature of ALD, films are grown at a rate of about one monolayer (ML) per deposition cycle.

A CVD method of depositing tungsten carbide from tungsten hexafluoride, hydrogen and a carbon-containing gas has been described in, for example, international patent application WO 00/47796. The carbon-containing compound is initially thermally activated. All of the gaseous source chemicals are introduced into a reaction space at the same time, resulting in the deposition of nonvolatile tungsten carbide on the substrate. A CVD reaction of $WF_6$ with trimethylamine and $H_2$ has been disclosed to yield WC films at 700° C.-800° C. and beta-$WC_x$ films at 400° C.-600° C. (Nakajima et al., J. Electrochem. Soc. 144 (1997) 2096-2100). The $H_2$ flow rate was found to affect the deposition rate of the tungsten carbide films.

PVD processes generally deposit along a line-of-sight. One method of depositing tantalum carbide for a diffusion barrier layer by PVD has been described in U.S. Pat. No. 5,973,400. A tantalum carbide layer was formed by sputtering tantalum or tantalum carbide under an $N_2/CH_4/Ar$ atmosphere. Line-of-sight deposition, however, means that complex substrate contours will have insufficient film coverage in shaded areas. Additionally, line-of-sight deposition means that low-volatility source material arriving directly from the source to the substrate will likely adhere to the first solid surface that it encounters, thus producing low-conformality coverage.

Accordingly, the properties of deposited films are related to the method used to deposit the films. There is a constant need for new methods and systems of depositing these films, as integration levels increase and the requirements for the deposited films change.

SUMMARY OF THE INVENTION

According to some embodiments of the invention, a method for depositing a metal carbide film is provided. The method comprises alternatingly exposing a substrate to pulses of a transition metal precursor and a plasma-excited argon species. The metal precursor is selected from the group consisting of transition metal halides and transition metal organic compounds. Metal from the metal precursor is reacted with a carbon species to form a metal carbide on the substrate.

According to some other embodiments of the invention, a method for depositing a metal carbide is provided. The method comprises exposing a substrate to metal and carbon-containing reactants to deposit a film comprising the metal and carbon. The film comprising the metal and carbon is exposed to a plasma-excited argon species to form a metal carbide film.

According yet other embodiments of the invention, a system for depositing metal carbide films is provided. The system comprises a reaction chamber; a plasma generator; a metal precursor source in gas communication with the reaction chamber; a carbon precursor source in gas communication with the reaction chamber; an argon source in gas communication with the reaction chamber; and a controller. The controller is programmed to provide a plurality of pulses of the metal precursor and the carbon precursor to the reaction chamber and to separately provide pulses of argon plasma into the reaction chamber between the pulses of the metal precursor and the carbon precursor.

BRIEF DESCRIPTION OF THE DRAWINGS

The invention will be better understood from the Detailed Description and from the appended drawings, which are meant to illustrate and not to limit the invention.

DETAILED DESCRIPTION OF SOME EMBODIMENTS

Figure 1:
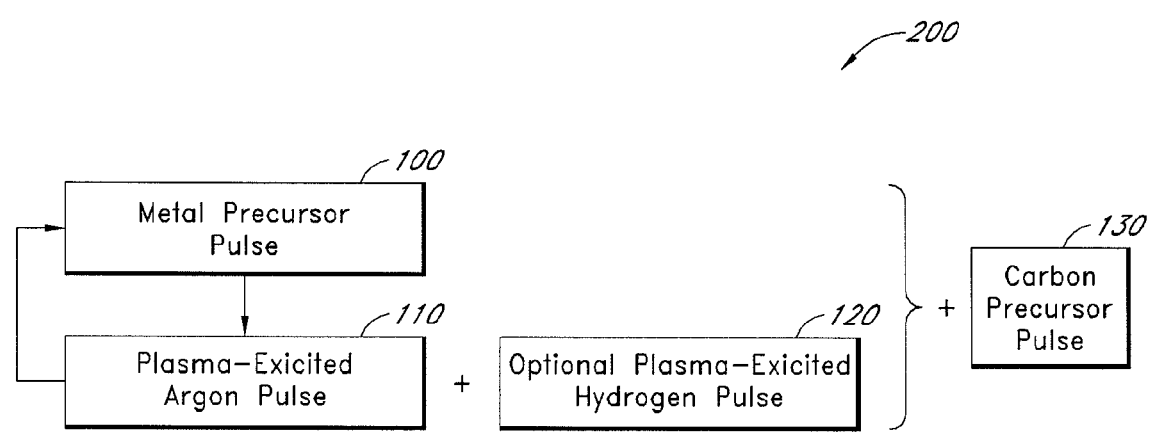
FIG. 1 is a block diagram of a pulsing sequence in a deposition process according to some embodiments of the invention.

Metal carbide films, e.g., tantalum carbide (TaC) films, can be used to form various structures, such as electrodes for transistors, e.g., n-channel metal-oxide field-effect transistors (nMOSFET's). In such applications, it is desirable for the films to have good adhesion to underlying materials and also low resistivity.

Embodiments of the invention advantageously allow metal carbide films, preferably transition metal carbide films, for example TaC films, to be formed with low resistivity and good adhesion. In some embodiments, a substrate is exposed to pulses of reactants (also referred to as precursors), e.g., by pulsing the flow of the reactants into a reaction chamber holding the substrate. In some embodiments, the substrate is exposed to a metal precursor in pulses alternating with pulses of plasma-excited argon. In addition, the substrate is exposed to a carbon species, which reacts with the metal precursor to form a metal carbide. In some embodiments, the carbon species can be a constituent of the metal precursor, so that the carbon species flows into the reaction chamber simultaneously with the metal precursor. For example, the metal species can be a metal organic compound in which carbon-containing ligands are attached to a metal atom. In some other embodiments, the carbon species is a separate precursor compound, which is flowed into a reaction chamber separately from the metal precursor and plasma-excited argon pulses.

Plasma-excited hydrogen can also be flowed into the reaction chamber with the pulses of the plasma-excited argon. The plasma-excited hydrogen can help to reduce the reactant species and/or deposited metal species. Where the metal precursor compound is a metal organic compound, the plasma-excited hydrogen and/or plasma-excited argon can facilitate the formation of the metal carbide by separating hydrocarbons from the metals to which the hydrocarbons are attached as organic ligands. The reducing agent can also aid in removal of undesired chemical species, including halogen atoms and/or oxygen atoms to form a film having low levels of impurities.

In some embodiments, the plasma-excited hydrogen is omitted from individual deposition cycles, which can have benefits for minimizing reaction of the plasma-excited hydrogen with underlying substrate materials. For example, the omission of the plasma-excited hydrogen can be beneficial for preventing damage to a dielectric material forming part of the substrate. In some embodiments, hydrogen from the carbon precursor can perform the function of reducing deposited metal species. The deposited films can offer lower stress and a higher level of adhesion to silicon-containing substrate materials, such as silicon or silicon oxide, relative to deposition with the plasma-excited hydrogen species. Thus, the use of plasma-excited argon alone can increase the process window for forming films with low levels of stress.

In preferred embodiments, the metal precursor comprises one or more metals selected from the group consisting of metals of Groups 3-12 of the periodic table and, more preferably, Groups 4-5 of the periodic table. For example, the metal precursor can include titanium (Ti), zirconium (Zr), hafnium (Hf), vanadium (V), niobium (Nb), and tantalum (Ta). In some embodiments, the metal precursor is a tantalum compound.

In some embodiments, the carbon precursor is a hydrocarbon. Preferably, the carbon precursor has a high ratio of hydrogens to carbon. An example of a suitable carbon precursor is methane ($CH_4$).

In some embodiments, the metal carbide deposition can occur at temperatures of about 150-550° C. These deposition temperatures advantageously allow embodiments of the invention to be compatible with a range of relatively temperature sensitive materials. It will be appreciated that some substrate materials are sensitive to and may be damaged by higher temperatures. Without being limited by theory, it has been found that the plasma-excited argon provides energy for the deposition, allowing the deposition to occur at lower temperatures than may otherwise be required. In addition, the limited reactivity of the argon species minimizes undesired side-reactions.

Reference will now be made to the Figures, in which like numerals refer to like parts throughout.

With reference to FIG. 1, a substrate in a reaction chamber is exposed to pulses of various precursors to deposit a metal carbide film. FIG. 1 illustrates certain steps in the deposition of the film. The steps together constitute a deposition cycle 200. In step 100, the substrate is exposed to a pulse containing a metal precursor. In some embodiments, the metal precursor is a transition metal precursor.

In step 110, the substrate is exposed to a pulse of plasma-excited argon. The step 100 is temporally separated from the step 110. In some embodiments, the plasma-excited argon pulse of step 110 can also include step 120, in which the substrate is exposed to plasma-excited hydrogen. Plasma-excited argon and plasma-excited hydrogen are used to designate one or more excited argon or hydrogen species formed via application of energy to a gas comprising one or more precursors. Energy may be applied (or coupled) to the gas via any of a variety of methods, such as inductive coupling, ultraviolet radiation, microwaves, capacitive coupling, application of RF power, etc. In the absence of coupling energy, plasma generation is terminated. Thus, the pulse 110 can be provided by constantly flowing argon during the deposition cycle and then pulsing the coupling energy to generate a pulse of plasma-excited argon species. In some embodiments, hydrogen gas is also constantly flowed into the chamber with the argon. In some embodiments, plasma is generated directly within the reaction chamber. Alternatively, plasma can be generated remotely, upstream of the reaction chamber, in a remote plasma generator.

The substrate is exposed to a carbon precursor in step 130. As discussed herein, the step 130 can be part of the pulse 100, or can be temporally separated from the pulses 100 and 110. Preferably, the carbon precursor is a hydrocarbon that is not plasma-exited.

It will be appreciated that, as used herein, exposing the substrate to a pulse of a precursor or gas can include flowing the precursor or gas into the reaction chamber for a set time and then terminating the flow into the reaction chamber.

In addition, reactant or active species removal steps have been omitted from the figures for ease of illustration and discussion. It will be appreciated, however, that in the illustrated embodiments (FIGS. 1-4), each of the illustrated pulses of precursors or gases can be followed, or separated from other pulses, by a removal step in which the precursors or gases are removed from the reaction chamber, e.g., by purging the reaction chamber with inert gas and/or evacuating gas from the reaction chamber. For example, the precursors can be flowed in the reaction chamber with an inert gas, such as argon, and the purge can include continuing to flow the carrier gas into the reaction chamber, without flowing any precursor into the reaction chamber with the carrier gas. In some embodiments, greater than about two reaction chamber volumes of the purge gas, or greater than about three chamber volumes of the purge gas can be flowed through the reaction chamber during a purge step. In some arrangements, the purge step includes flowing the purge gas for between about 0.1 seconds and about 20 seconds between pulses of reactants and/or plasma excited species.

As used herein, a "substrate" is any surface on which deposition is desired, and in some embodiments can include any workpiece that is suitable for integrated circuit (IC) fabrication. Typical substrates include, without limitation, silicon, silica, coated silicon and metal oxides, including high k metal oxides. Examples of metal oxides include, without limitation, aluminum oxide, hafnium oxide and tantalum oxide. A substrate can include a silicon wafer.

The reaction chamber accommodating the substrate is a volume in a deposition reactor in which conditions can be adjusted to facilitate film growth. The reactor can be a plasma enhanced deposition reactor, e.g., a single-wafer plasma enhanced ALD (PEALD) reactor or a batch PEALD reactor, which accommodates a plurality of substrates for deposition on multiple substrates, the deposition taking place at the same time. As another example, the reaction chamber can be in a single-wafer CVD reactor.

With continued reference to FIG. 1, the metal precursor pulse 100 and carbon precursor pulse 130 can be carried out in various ways.

Figure 2A:
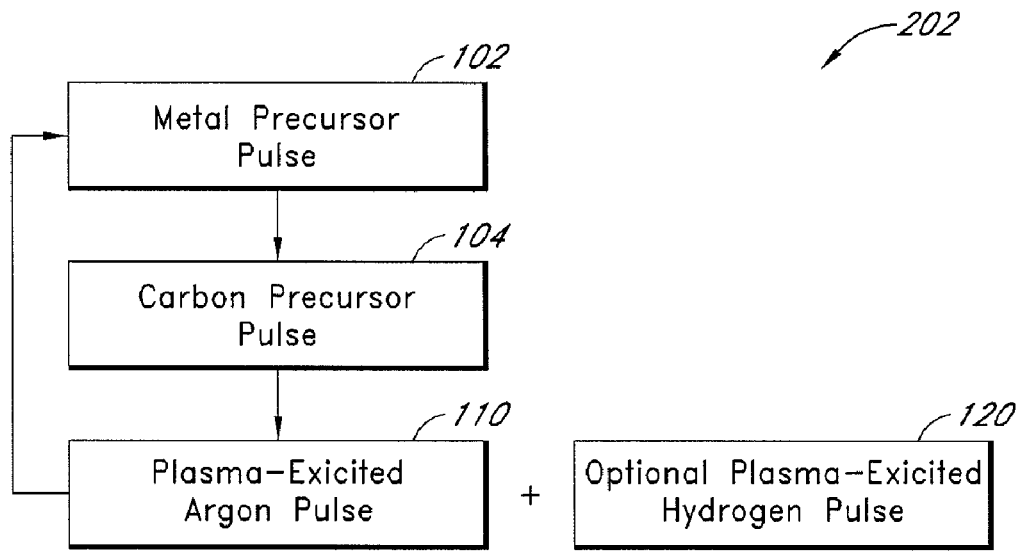
FIGS. 2A and 2B are block diagrams of pulsing sequences in a deposition process according to some embodiments of the invention.
Figure 2B:
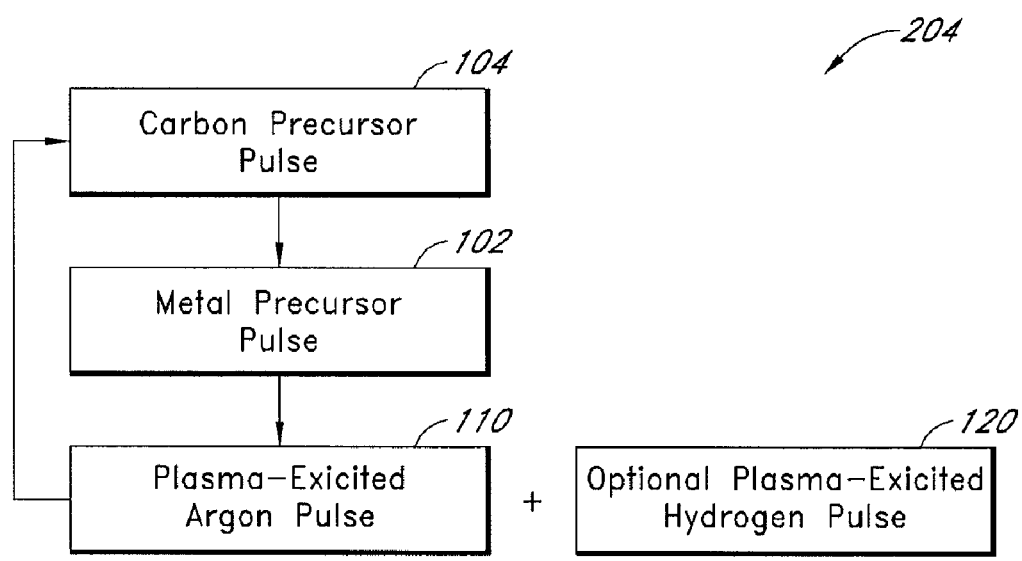

With reference to FIGS. 2A-2B, the metal precursor and carbon precursor can be pulsed into the reaction chamber in temporally separated pulses. The carbon precursor pulse 104 can come between the metal precursor pulse 102 and plasma-excited argon pulse 110 (FIG. 2A) or the metal precursor pulse 102 can come between the carbon precursor pulse 104 and the plasma-excited argon pulse 110 (FIG. 2B). Along with the plasma-excited argon in step 110, the substrate can be simultaneously exposed to plasma-excited hydrogen in step 120. In some embodiments, the metal precursor is a transition metal halide, such as a tantalum halide, such as $TaF_5$, and the carbon precursor is a hydrocarbon, including an alkane, alkene, and/or alkyne. For example, the carbon precursor can be a compound having a high H/C ratio, such as $CH_4$. Carbon precursors having a high H/C ratio facilitate the formation of films having low resistivities (e.g., about 300 μOhm·cm) even while using low plasma power for the step 110 (e.g., about 25-200 W, about 35-75 W, or about 50 W), which has benefits for forming a film with high adhesion to the substrate. The steps illustrated in FIGS. 2A and 2B constitute deposition cycles 202 and 204, respectively.

With continued reference to FIG. 2B, the halide species of the transition metal halide is typically chemically separated from the transition metal in the course of the deposition of the metal carbide. It will be appreciated that halides, such as fluorine, can act as etchants and may etch the underlying substrate material. Exposing the substrate to the carbon species forms a protective carbon layer over the substrate before the substrate is exposed to the metal precursor. The carbon layer advantageously protects the substrate from halide species originating from the metal precursor, thereby preventing deformation and damage to the underlying substrate.

With reference to both FIGS. 2A-2B, the separate metal and carbon precursor pulses allow the metal and carbon content of the metal carbide film to be actively controlled. For example, the flow rates, durations of the pulses and/or the number of the metal or carbon precursor pulse per cycle can be increased, to increase the content of the metal or the carbon; or decreased, to decrease the content of the metal or the carbon.

Figure 3:
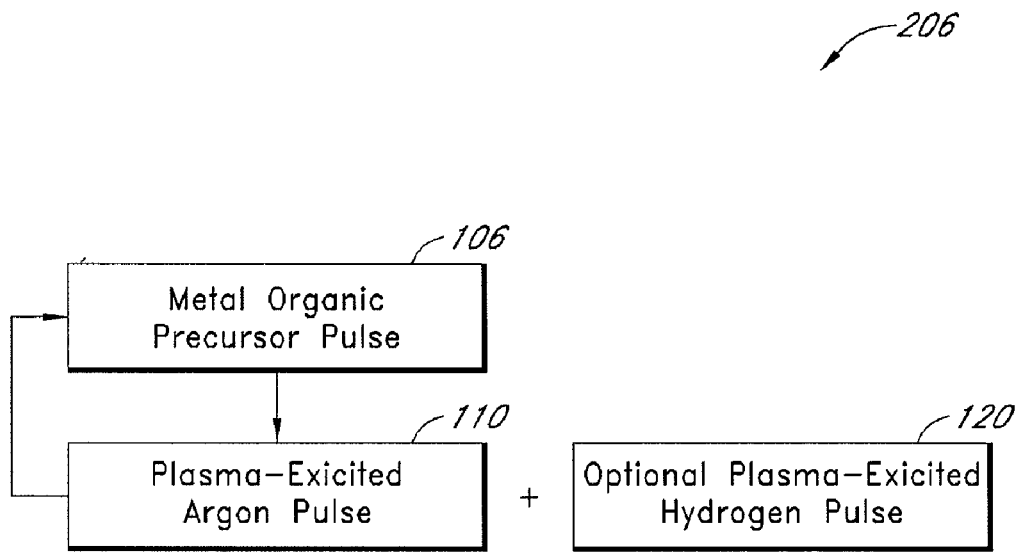
FIG. 3 is a block diagram of a pulsing sequence in a deposition process according to some embodiments of the invention.

With reference to FIG. 3, the substrate can be exposed to the metal precursor and the carbon precursor in the same pulse in a deposition cycle 206. In some embodiments, the metal precursor and the carbon precursor are the same precursor, e.g., a metal organic compound. Thus, one or more carbons for forming the metal carbide is already bonded to the metal. Hydrogens from the ligands can react with the metal to control the valence state of the metal and prevent the formation of metal oxide.

With continued reference to FIG. 3, the substrate is exposed to the metal organic precursor in step 106. The metal organic compound includes a metal having one and, in some embodiments, a plurality of carbon-containing ligands. The carbon-containing ligands can include alkanes, alkenes, and/or alkynes. One or more of the ligands can be a hydride. Preferably, the metal organic compound consists only of the metal, carbon and hydrogen. The metal organic compound can be, e.g., a metal cyclopentadienyl compound. Non-limiting examples of other metal organic compounds include $Me_3CCH=Ta(CH_2CMe_3)_3$ and $Ta(EtCp)_2H_3$ (bis(ethylcyclopentadienyl)trihydridotantalum).

The substrate is then exposed to plasma-excited argon in the step 110. The step 110 can also include the step 120, in which the substrate is exposed to plasma-excited hydrogen.

Advantageously by exposing the substrate to both metal and carbon precursors in the same pulse, a separate carbon precursor pulse and possible intervening purge step are unnecessary. Thus, throughput can be increased, since the total deposition cycle time is reduced.

In addition, in some embodiments, hydrogen atoms in the ligands can react with the metal to prevent oxidation of the metal without using a plasma-excited hydrogen species. Thus, possible damage to underlying substrate materials by reaction with the plasma-excited hydrogen species can be avoided.

Figure 4:
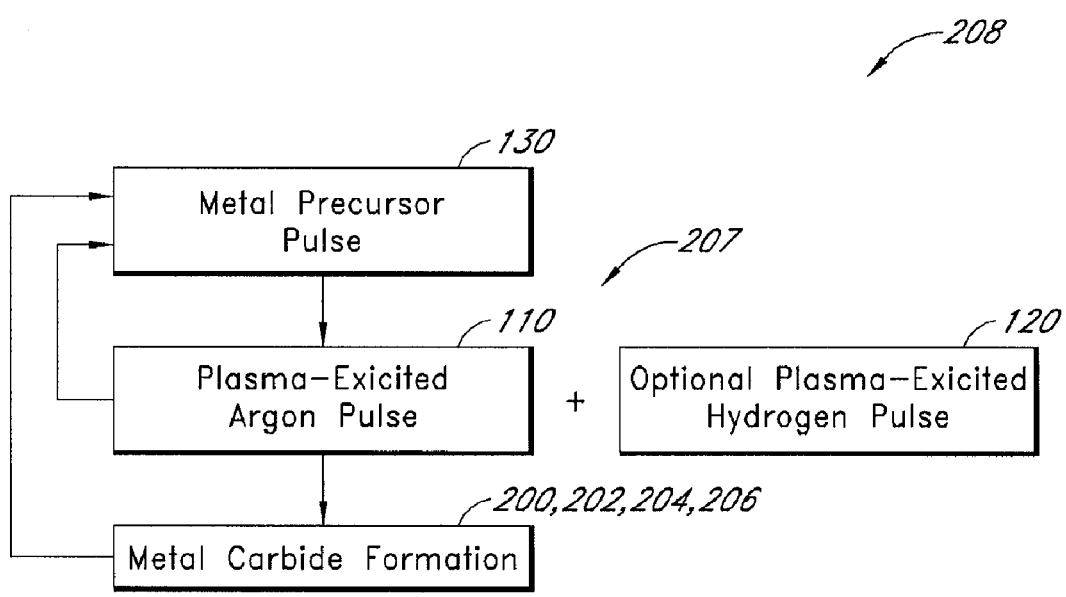
FIG. 4 is a block diagram of a pulsing sequence in a deposition process according to some embodiments of the invention.

With reference to FIG. 4, any of the cycles 200, 202, 204 and 206 (FIGS. 1-3) can be combined with another metal deposition cycle to form a nanolaminate film. In step 130 a substrate in a reaction chamber is exposed to a metal precursor. In some embodiments, the metal precursor is the same precursor as that used in the step 102, although different precursors can be used in each of the steps 130 and 102.

In step 110, the metal precursor is exposed to plasma-excited argon. Optionally and additionally the step 110 can include the step 120 in which the substrate is also exposed to plasma-excited hydrogen. The plasma-excited species can aid in the removal of ligands from the deposited metal precursor, thereby preparing the surface of the deposited metal layer for deposition of additional precursor material. The steps 130 and 110 constitute a metal deposition cycle 207, also referred to as a metal cycle. The metal cycle 207 can be sequentially repeated a plurality of times, until a metal film of a desired thickness is formed.

Next, a metal carbide is formed by performing any of the metal/carbon cycles 200, 202, 204 and 206. The cycles 200, 202, 204 or 206 can be sequentially repeated until a metal carbide film of a desired thickness is formed. In some embodiments, combinations of the cycles 200, 202, 204 and 206 can be performed between the metal cycles 207 to form the metal carbide film.

The cycle 207 and one or more of the cycles 200, 202, 204 and 206 constitute a deposition cycle 208. The deposition cycle 208 can be sequentially repeated until a nanolaminate of a desired thickness is formed.

It will be appreciated that each of the cycles 200, 202, 204, 206 and 208 can be repeated a plurality of times until a metal carbide film of a desired thickness is deposited. "Film" means a film that is grown on a substrate from elements or compounds that are transported as separate ions, atoms or molecules from a source to the substrate. "Metal carbide film" designates a film comprising metal and carbon. The metal may be a single elemental metal or a plurality of metals, such as a metal alloy. The metal carbide film may be stoichiometric, e.g, TaC, or non-stoichiometric, e.g., $TaC_x$, where 'x' is greater than one if the film has excess carbon or less than one if the film is carbon deficient. The thickness of the film will depend upon the application and may vary in a wide range, preferably from one atomic layer to 1,000 nanometers (nm) or more. In some embodiments, the film is less than about 50 nm in thickness, or less than about 20 nm, or less than about 10 nm.

The metal carbide film formed can be a component of an integrated circuit (IC), such as, e.g., a conductive diffusion barrier forming a part of a line in a dual damascene structure, a metal gate electrode, such as an NMOS gate electrode, or an anti-reflective coating. In other embodiments, the metal carbide film may form a part of hard coating on a substrate to protect against mechanical wear, or may be used as a component of a corrosion protection layer. In still other embodiments, the metal carbide film can be, e.g., used as part of a chemical reaction catalyst or as an etch stop barrier.

The present invention advantageously enables metal carbide film formation by employing plasma-excited argon species, which, without being limited by theory, are believed to provide sufficient energy to promote reaction of the metal with the carbon species at lower temperatures, e.g., about 500° C. or less, or about 400° C. or less. Plasma production generates radicals of the argon. Because radicals have substantially short lifetimes, metal carbide formation occurs primarily at locations where the substrate or workpiece in the reaction space is in view of the plasma-excited argon species. As such, metal carbide films can be formed in a controlled manner, and undesirable consequences of plasma usage, such as electrical shorts resulting from uncontrolled metal carbide deposition, can be reduced or prevented.

In some arrangements, the deposition can be an ALD-type process. In an ALD-type process, reactants are alternately and sequentially pulsed into a reaction chamber where they contact a substrate to provide a surface reaction. Typically, reaction conditions are selected such that about one monolayer or less (i.e. an atomic layer or a molecular layer or less) of material is deposited for each pulse. This monolayer deposition can be facilitated by use of reactants that deposit self-limitingly on a surface, so that the deposition stops once the surface is saturated with the deposited reactants.

Typically, metal halide reactants, such as, e.g., $TaF_5$, $TaCl_5$ and $HfCl_4$, are used as metal precursors in ALD. For example, in one deposition cycle, the metal precursor is pulsed to the reaction chamber and chemisorbs onto the substrate surface, forming no more than about one monolayer on the surface of the substrate. The metal source material in this phase is selected such that, under the preferred conditions, the amount of metal source material that can be bound to the surface is determined by the number of available binding sites and by the physical size of the chemisorbed species (including ligands). The chemisorbed metal layer left by a pulse of the metal source chemical is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting.

Excess metal source material and reaction byproducts (if any) are then removed from the reaction chamber. Next, a carbon precursor is flowed into the reaction chamber and a subsequent pulse of plasma-excited argon provides sufficient activation energy for the carbon precursor and the previously deposited metal layer to react to form a metal carbide. Excess carbon precursor and/or reaction byproducts, if any, are then removed from the reaction chamber.

Advantageously, gas phase reactions between precursors and any undesired reactions of byproducts are inhibited because precursor pulses are temporally separated from each other and the reactants are removed from the reaction chamber, e.g., by purging with an inactive gas (e.g., nitrogen, argon, or hydrogen) and/or evacuation using, e.g., a pumping system between precursor pulses to remove surplus reactants and reaction byproducts from the chamber.

In some other arrangements, the deposition can be a CVD-type process. In a CVD-type process, the source materials needed for film growth are present in the reaction space simultaneously for at least part of the deposition time. Thus, the concentration profiles of the source materials in the reaction space with regard to time are overlapping.

With reference to FIGS. 1-4, in some embodiments, the substrate temperature is maintained at a temperature from about 150° C. to about 550° C., or about 300° C. to about 400° C. The chamber is preferably maintained at a pressure from about 200 mTorr to about 10 Torr, or about 1 Torr to about 6 Torr. The plasma power is in the range from about 50 W to about 400 W. Argon can be flowed continuously into the reaction during the deposition at a flow rate in the range of about 100 to about 1000 sccm, e.g., about 300 sccm. In some embodiments, the argon can be the carrier gas for the metal precursor, which then has a carrier gas flow rate in the range of about 100 to about 400 sccm, e.g., about 300 sccm.

In some embodiments in which the carbon precursor is separate from the metal precursor, the carbon precursor is flowed into the reaction chamber at a flow rate in the range of about 200 to about 500 sccm. In some embodiments in which a plasma-excited hydrogen species is utilized, the hydrogen can be flowed into the reaction chamber at a rate in the range of about 0 to about 100 sccm.

Advantageously, the properties of deposited materials can be tailored by appropriate selection of deposition parameters. For example, the plasma power can be varied to achieve a desired roughness, density and impurity level. Higher plasma power can give lower levels of impurities and higher densities, while lower plasma power can decrease the film roughness and increase film adhesion. In addition, as noted above, total pulse durations and flow rates can be increased or decreased to increase or decrease the amount of the pulsed material in the deposited film. Also, the substrate can be exposed to one or more different metal precursors in each of the 200, 202, 204, 206 and 208. For example, one or more additional metal precursors can flowed in pulses separate from the pulses of the other metal precursor, the carbon precursor, or the plasmas-excited argon species. Also, plasma-excited hydrogen species can provided simultaneously with, or in pulses different from, the plasma-excited argon species.

Figure 5:
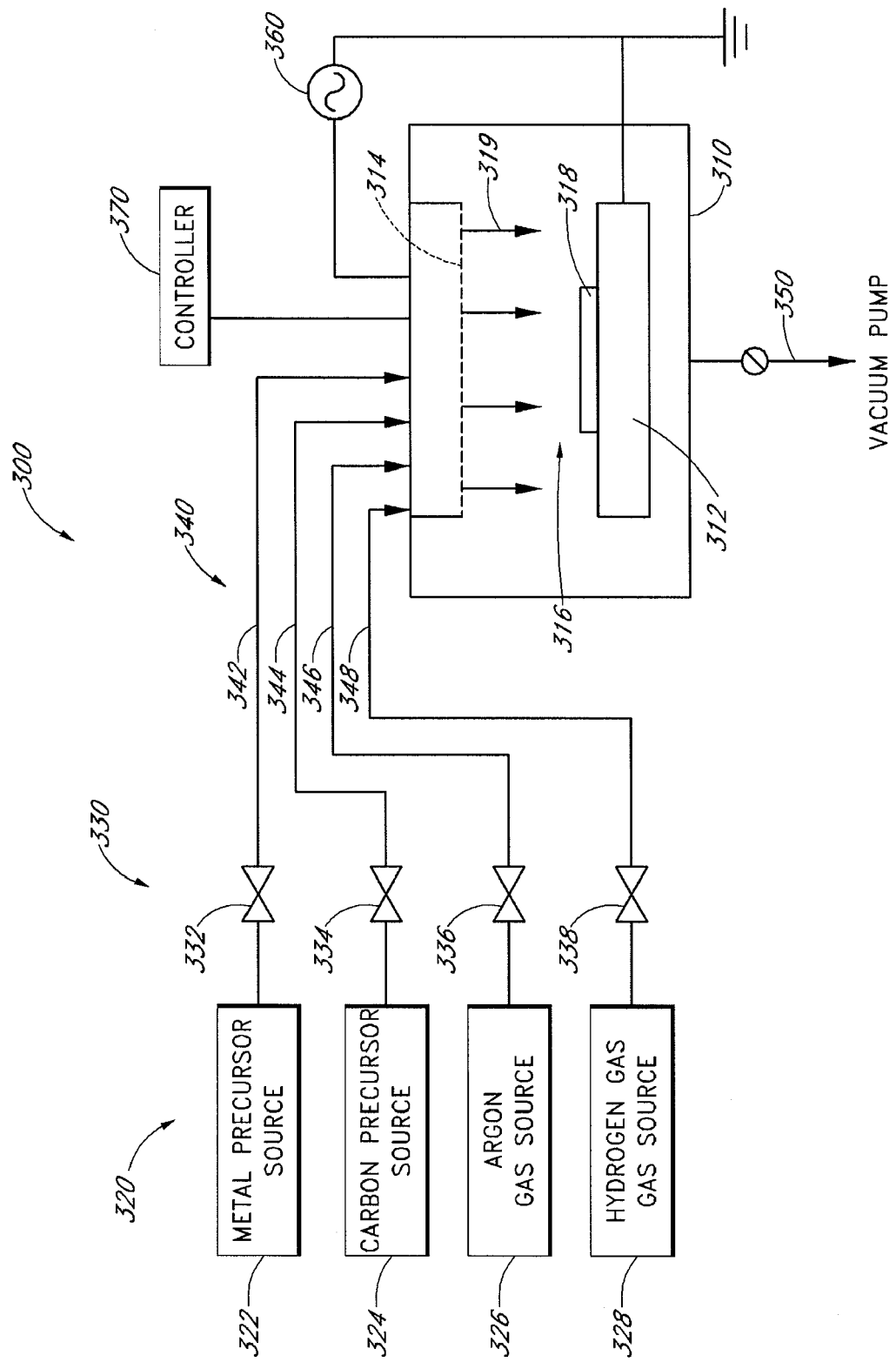
FIG. 5 is a schematic diagram of a plasma-enhanced atomic layer deposition (PEALD) system according to some embodiments of the invention.

The skilled artisan will appreciate that various types of deposition systems can be adapted for the deposition processes disclosed herein. In some embodiments, the deposition processes can be carried out in a plasma-enhanced atomic layer deposition (PEALD) system 300 shown in FIG. 5. The illustrated system 300 includes a reactor 310, gas sources 320, valves 330, gas supply lines 340, a gas exhaust line 350, a radio frequency (RF) power source 360, and a controller 370.

The reactor 310 includes a substrate holder or susceptor 312 and a showerhead plate 314. The substrate holder 312, the showerhead plate 314, and inner walls of the reactor 310 together define a reaction space 316 in which a substrate 318 is processed. The showerhead plate 314 is positioned over the substrate holder 312 with a plurality of openings facing the substrate holder 312. The substrate holder 312 is configured to support the substrate 318 during a deposition process. In the illustrated embodiment, a substantially vertical flow 319 of gases is generated over the substrate 318 within the reaction space 316 by the showerhead plate 314. In other embodiments, a reactor may be configured to generate a horizontal or laminar flow over a substrate. The skilled artisan will appreciate that various configurations of reactors can be adapted for deposition processes which will be described below.

The gas sources 320 include a metal precursor source 322, a carbon precursor source 324, an argon gas source 326, and a hydrogen gas source 328. In some embodiments, the metal precursor can include a carbon source, e.g., where the metal precursor is a metal organic compound, and the separate carbon source 324 can be omitted. Each of the gas sources 322, 324, 326, 328 is in fluid communication with the reactor 310 via a respective one of the gas supply lines 342, 344, 346, 348. In addition, each of the gas supply lines 342, 344, 346, 348 is provided with a valve 332, 334, 336, 338, respectively, for controlling the flow rate of the gas supplied to the reactor 310.

The gas exhaust line 350 is configured to exhaust gases from the reactor 310. In the illustrated embodiment, the gas exhaust line 350 is connected to a vacuum pump for facilitating exhausting gases from the reactor 310.

The RF power source 360 applies RF power to the reaction space 316 so as to generate plasma. In the illustrated embodiment, RF power can be applied to the reaction space 316 by turning on the RF power source 360. In another embodiment, while the RF power source 360 is kept on during the deposition process, a switch may be used to make electrical connection or disconnection between the RF power source 360 and the reaction space 316.

In the illustrated embodiment, a positive electrode (not shown) is in electrical contact with the showerhead plate 314. A negative electrode is in electrical contact with the substrate holder 312, and is grounded. Plasma is generated between the showerhead plate 314 and the substrate 318 when a gas is introduced into the reactor 310 and RF power is applied to the reactor 310 through the electrodes. Factors affecting plasma generation include, without limitation, RF power on time, RF power amplitude, RF power frequency, reactant concentration, reactant flow rate, reaction space pressure, total gas flow rate, reactant pulse durations and separations, and RF electrode spacing. These factors may be selected to achieve desired deposition results.

The controller 370 controls the components of the PEALD system 300 to effectuate the deposition process and pulsing sequences disclosed herein. For example, the controller 370 may be programmed to control the valves 330 to supply predetermined amounts of gases required for a deposition recipe in a timely manner. The controller 370 may also control the RF power source to apply RF power to the reactor in a timely manner. In addition, the controller 370 may control the exhaust line 350 and the vacuum pump in a timely manner to regulate the exhaust of gases out of the reaction space 316. The controller 3170 may also control substrate loading/unloading operations for the reactor 310. The controller 370 may be a general purpose computer or a customized microprocessor programmed to control various parts of the PEALD system 300. The controller 370 may also include other peripheral components such as a memory and a user interface. A skilled artisan will appreciate that various configurations of controllers can be used for the PEALD system 300.

EXAMPLE 1

Various tantalum carbide film deposition runs were performed in the EmerALD 3000™ plasma enhanced atomic layer deposition PEALD Process Module of a Polygon® 8200, 8300 available from ASM International N.V. of Bilthoven, The Netherlands. In each run, the tantalum carbide film was deposited on the silicon dioxide ($SiO_2$) surface of a substrate. The sequence of steps included alternately and sequentially pulsing a carbon-containing precursor (methane, $CH_4$), a metal precursor ($TaF_5$), and plasma-excited argon gas into a reaction chamber accommodating the substrate. The deposition was conducted at a substrate temperature of about 350° C. and a pressure of about 2-5 Torr. Methane was introduced into the reactor at a flow rate of about 300 sccm. Argon gas was used as the carrier gas for the metal precursor and the carbon-containing precursor. The flow rate of the argon gas was held at approximately 300 sccm. Plasma-excited argon species were generated by supplying power (about 50-400 W) to a showerhead disposed over the substrate. The sequence of gas pulses and pulsing times (seconds, "s") were as follows:
(1) $CH_4$ pulse (2-4 s);
(2) Ar purge (2-4 s);
(3) $TaF_5$ pulse (1-2 s);
(4) Ar purge (2-4 s);
(5) Plasma-excited argon pulse (6 s); and
(6) Ar purge (2-4 s).

Steps (1)-(6) were repeated approximately 300 times to form a tantalum carbide film with thickness of about 200 Å. The film was subsequently treated with plasma-excited $H_2$ species for 30 s. The film growth rate was about 06-1.2 Å/cycle, and about 0.7 Å/cycle on average.

The deposited films were found to lower resistivities and higher densities than films deposited using plasma-excited carbon species in a pulsed deposition with a metal precursor. The resistivity was about 700 μOhm·cm. The density was about 10-11 g/cm$^3$.

EXAMPLE 2

Tantalum carbide film deposition runs were performed in the EmerALD 3000™ plasma enhanced atomic layer deposition PEALD Process Module of a Polygon® 8200, 8300 available from ASM International N.V. of Bilthoven, The Netherlands. In each run, the tantalum carbide film was deposited on the silicon dioxide ($SiO_2$) surface of a substrate. A carbon-containing precursor (methane, $CH_4$), a metal precursor ($TaF_5$), and plasma-excited argon and hydrogen gas were alternately and sequentially pulsed into a reaction chamber accommodating the substrate. The substrate deposition temperature was about 350° C. and the pressure about 2-5 Torr. Methane was flowed into the reactor at about 300 sccm. Argon gas was used as the carrier gas the precursors and had a total flow rate of approximately 300 sccm. Hydrogen was flowed into the reaction chamber at a rate of about 25-100 sccm. Plasma-excited argon species were generated by supplying power (about 50-400 W) to a showerhead disposed over the substrate. The sequence of gas pulses and pulsing times (seconds, "s") were as follows:

(1) $CH_4$ pulse (2-4 s);
(2) Ar purge (2-4 s);
(3) $TaF_5$ pulse (1-2 s);
(4) Ar purge (2-4 s);
(5) Plasma-excited argon and hydrogen pulse (6 s); and
(6) Ar purge (2-4 s).

Steps (1)-(6) were repeated approximately 200 times to form a tantalum carbide film with thickness of about 200 Å. The film growth rate was about 06-1.2 Å/cycle, and about 09 Å/cycle on average.

The deposited films were found to lower resistivities and higher densities than films deposited using plasma-excited carbon species. The resistivity was about 250 μOhm·cm. The density was between about 13 $g/cm^3$.

It will be understood by those skilled in the art that, although this invention has been disclosed in the context of certain embodiments and examples, the present invention extends beyond the specifically disclosed embodiments to other alternative embodiments and/or uses of the invention and obvious modifications and equivalents thereof. It is also contemplated that various combinations or sub-combinations of the specific features and aspects of the embodiments may be made and still fall within the scope of the invention. Accordingly, it is intended that the scope of the present invention disclosed herein should not be limited by the particular disclosed embodiments described above, but should be determined by the claims that follow.

We claim:

1. A method for depositing a metal carbide film, comprising:
   alternatingly exposing a substrate to pulses of a transition metal precursor and a plasma-excited argon species, the metal precursor selected from the group consisting of transition metal halides and transition metal organic compounds; and
   reacting metal from the metal precursor with a carbon species to form a metal carbide on the substrate.

2. The method of claim 1, wherein the metal halides are selected from the group consisting of metal bromides, metal chlorides, metal fluorides and metal iodides.

3. The method of claim 2, wherein the metal halide is $TaF_5$.

4. The method of claim 2, further comprising exposing the substrate to a pulse of a hydrocarbon between each metal precursor pulse and plasma-excited species pulse.

5. The method of claim 4, wherein the hydrocarbon is selected from the group consisting of alkanes, alkenes and alkynes.

6. The method of claim 5, wherein the hydrocarbon is methane ($CH_4$).

7. The method of claim 1, wherein the carbon species is derived from the metal precursor.

8. The method of claim 7, wherein the metal precursor is a metal organic compound, and wherein reacting the metal comprises reacting a carbon-containing ligand of the metal with the metal.

9. The method of claim 8, wherein the carbon-containing ligand is an alkyl group.

10. The method of claim 8, wherein the metal precursor comprises a plurality of carbon-containing ligands.

11. The method of claim 1, wherein exposing the substrate to pulses of the plasma-excited argon species comprises exposing the substrate to plasma-excited argon and hydrogen species.

12. The method of claim 1, wherein exposing the substrate to the metal precursor self-limitingly deposits a layer of the metal on the substrate, wherein reacting metal from the metal precursor with the carbon species comprises reacting the layer of the metal after depositing the layer of the metal.

13. A method for depositing a metal carbide, comprising:
    exposing a substrate to metal and carbon-containing reactants to deposit a film comprising the metal and carbon; and
    exposing the film comprising metal and carbon to a plasma-excited argon species to form a metal carbide film.

14. The method of claim 13, wherein exposing the substrate to metal and carbon-containing reactants comprises depositing a protective layer on the substrate before exposing the substrate to the metal-containing reactant.

15. The method of claim 14, wherein depositing the protective layer comprises depositing a carbon-containing layer by exposing the substrate to the carbon-containing reactant.

16. The method of claim 15, wherein exposing the substrate to metal and carbon-containing reactants comprises exposing the protective layer to the metal-containing reactants to form the film comprising metal and carbon.

17. The method of claim 13, further comprising sequentially repeating exposing the substrate and exposing the film to form a metal carbide film of a desired thickness.

18. The method of claim 13, wherein exposing the substrate to metal and carbon-containing reactants comprises exposing the substrate to a single precursor containing the metal and carbon.

19. The method of claim 13, further comprising:
    alternatingly exposing the substrate to a pulse of a metal precursor and a pulse of plasma-excited argon species.

20. The method of claim 19, wherein sequentially exposing the substrate to one pulse of the metal precursor and one pulse of plasma-excited argon species constitute a metal deposition cycle, wherein exposing the substrate to metal and carbon-containing reactants and exposing the film constitute a metal/carbon cycle, further comprising performing a plurality of consecutive metal cycles followed by a plurality of consecutive metal/carbon cycles.

21. The method of claim 20, further comprising sequentially repeating performing the plurality of consecutive metal cycles followed by the plurality of consecutive metal/carbon cycles to form a nanolaminate film.

22. The method of claim 13, wherein exposing the film to the plasma-excited argon species comprises exposing the film to plasma-excited argon and hydrogen species.

23. The method of claim 13, wherein exposing the substrate to metal and carbon-containing reactants comprises exposing the substrate to a transition metal precursor.

24. The method of claim 23, wherein the transition metal is selected from the group consisting of titanium (Ti), zirconium (Zr), hafnium (Hf), vanadium (V), niobium (Nb).

25. The method of claim 24, wherein the transition metal is tantalum (Ta).

26. The method of claim 13, wherein exposing the substrate to metal and carbon-containing reactants is performed below a decomposition temperature of the metal and carbon-containing reactants.

27. The method of claim 13, wherein exposing the substrate to metal and carbon-containing reactants is performed at a deposition temperature of about 150° C. to about 550° C.

28. The method of claim 13, wherein the plasma-excited argon species is formed within a reaction chamber accommodating the substrate.

29. The method of claim 13, wherein exposing the substrate to metal and carbon-containing reactants comprises depositing about a monolayer of a compound comprising the metal.

30. The method of claim 13, wherein forming the metal carbide film forms an electrode for an electronic device.

31. The method of claim 30, wherein forming the metal carbide forms an electrode for a transistor.

* * * * *